(12) United States Patent
Frazier et al.

(10) Patent No.: US 6,430,288 B1
(45) Date of Patent: Aug. 6, 2002

(54) PHONE LINE SPLITTER ASSEMBLY

(75) Inventors: Brent Frazier, Keller; Mark Appenzeller, N. Richland Hills, both of TX (US); Roger Paradis, Beloeil (CA)

(73) Assignee: Corning Cable Systems LLC, Hickory, NC (US)

( * ) Notice: Subject to any disclaimer, the term of this patent is extended or adjusted under 35 U.S.C. 154(b) by 0 days.

(21) Appl. No.: 09/418,060

(22) Filed: Oct. 14, 1999

(51) Int. Cl.[7] .............................................. H04M 1/00
(52) U.S. Cl. .................................................. 379/413.04
(58) Field of Search ................................ 379/399, 326, 379/327, 413.04; 361/725, 727

(56) References Cited

U.S. PATENT DOCUMENTS

| | | | |
|---|---|---|---|
| 4,538,868 A | | 9/1985 | Cruise et al. ............... 339/34 |
| 4,673,771 A | | 6/1987 | Grant ......................... 174/38 |
| 5,008,931 A | * | 4/1991 | Siemon et al. ............ 379/399 |
| 5,727,055 A | * | 3/1998 | Ivie et al. ................... 379/399 |
| 5,903,643 A | | 5/1999 | Bruhnke .................... 379/399 |
| 6,078,503 A | * | 6/2000 | Gallagher et al. ......... 361/725 |

FOREIGN PATENT DOCUMENTS

| | | | | |
|---|---|---|---|---|
| EP | 0909102 A2 | 4/1999 | ............ | H04Q/1/14 |
| EP | 0928096 A2 | 7/1999 | .......... | H04M/11/06 |

\* cited by examiner

*Primary Examiner*—Jack Chiang

(57) ABSTRACT

Improved splitter assemblies are described that can accept multiple incoming POTS lines and split each. In the preferred embodiments described herein, each of the incoming POTS lines is split into a voice line and a data line. The exemplary splitter assemblies described herein provide a card retainer that holds a plurality of POTS splitter cards. The splitter assemblies provide a hinged faceplate that retains a plurality of tool-less IDCs to form a panel to which electrical connections can be easily made in order to attach the incoming POTS lines and outgoing voice and data lines. In one preferred embodiment, a protective housing encloses the card retainer to provide a substantially weather-resistant enclosure for the card retainer. This housing is shaped and sized to be easily mounted in or adjacent to an existing building entrance terminal. The card retainer within has a number of retainer slots for splitter cards. Vents are disposed between the slots so that the cards can receive ventilation. The inside cover of the protective housing retains a test probe assembly that allows the connections with individual tool-less IDCs to be tested for integrity. A second splitter assembly is described wherein the card retainer is affixed directly to the backside of the outer panel of a building entrance terminal, particularly one that is located indoors or protected from the elements.

9 Claims, 6 Drawing Sheets ized in size.

PHONE LINE SPLITTER ASSEMBLY

BACKGROUND

The present invention is directed to devices used to split a telephone line into multiple lines. In preferred embodiments, the invention is directed to devices that are capable of receiving and splitting multiple telephone lines in this manner.

In conventional arrangements, telephone company carriers provide drop lines to a building, residence, or other structure. These incoming drop lines are often referred to in the industry as POTS (plain old telephone service) lines. For buildings and multiple dwelling unit structures, such as apartment complexes and condominiums, the point at which the POTS lines interface with the internal wiring of the facility has become known as the subscriber demarcation. This demarcation is typically housed in a building entrance terminal. At this location, the incoming POTS lines are electrically interconnected with the internal telephone lines of the facility to provide a plurality of useable telephone lines within the facility. The building entrance terminal is typically a cabinet-like structure that may be located either inside or outside of the facility. However, these cabinets are often afforded a limited amount of established space, and they cannot be easily expanded in size.

As internet access, facsimile machines, and other data transmission services have developed, the demand for more twisted pair lines has rapidly increased. The need for more lines is further complicated by the time and space intensive work typically associated with installing new copper lines to accommodate the additional capability. However, not only are more data transmissions required, but also faster data transmissions, pushing the threshold of telephony technology.

With the advent of DSL (digital subscriber line) technology, the installation and higher speed concerns were addressed. However, the need to transport this technology all the way the the subscriber over multiple lines still existed. Single line splitter modules, that are capable of dividing a single telephone line into two separate, operable telephone lines, are bulky if several are used in a multiple line application and often will not fit easily into existing building entrance terminals. In addition, there is no currently known device that will divides multiple incoming POTS lines into separate voice and data lines.

In addition to the need for small, efficient splitter devices, there is also a need for a mechanism that permits rapid retrofitting of splitter devices between different DSL protocols. For example, if ADSL (asynchronous digital subscriber lines) boards are replaced with VDSL (very high data rate digital subscriber lines) ones, the splitter devices must also be replaced in order to accommodate the new protocol However, there is no way to do this other than by disconnecting the electrical connections made to each of the individual splitter devices and then reconnecting new splitter devices. This requires a significant amount of new components and fine electrical work to complete.

SUMMARY OF THE INVENTION

The present invention provides for an improved splitter assembly that can accept multiple incoming POTS lines and split each. In the preferred embodiments described herein, each of the incoming POTS lines is split into a voice line and a data line. The exemplary splitter assemblies described herein provide a card retainer that holds a plurality of POTS splitter cards. The splitter assemblies provide a hinged faceplate that retains a plurality of tool-less IDC's (insulation displacement connectors) to form a panel to which electrical connections can be easily made in order to attach the incoming POTS lines and outgoing voice and data lines.

In one preferred embodiment, the invention provides an improved protective housing for the card retainer that provides a substantially weather-resistant enclosure for the card retainer. This housing is shaped and sized to be easily mounted in or adjacent to an existing building entrance terminal. The card retainer within has a number of retainer slots for splitter cards. Vents are disposed between the slots so that the cards can receive ventilation. The inside cover of the protective housing retains a test probe assembly that allows the connections with individual IDCs to be tested for integrity.

In a second preferred embodiment, the card retainer is affixed directly to the backside of the outer panel of a building entrance terminal, particularly one that is located indoors or protected from the elements.

DETAILED DESCRIPTION OF THE INVENTION

Figure 1:
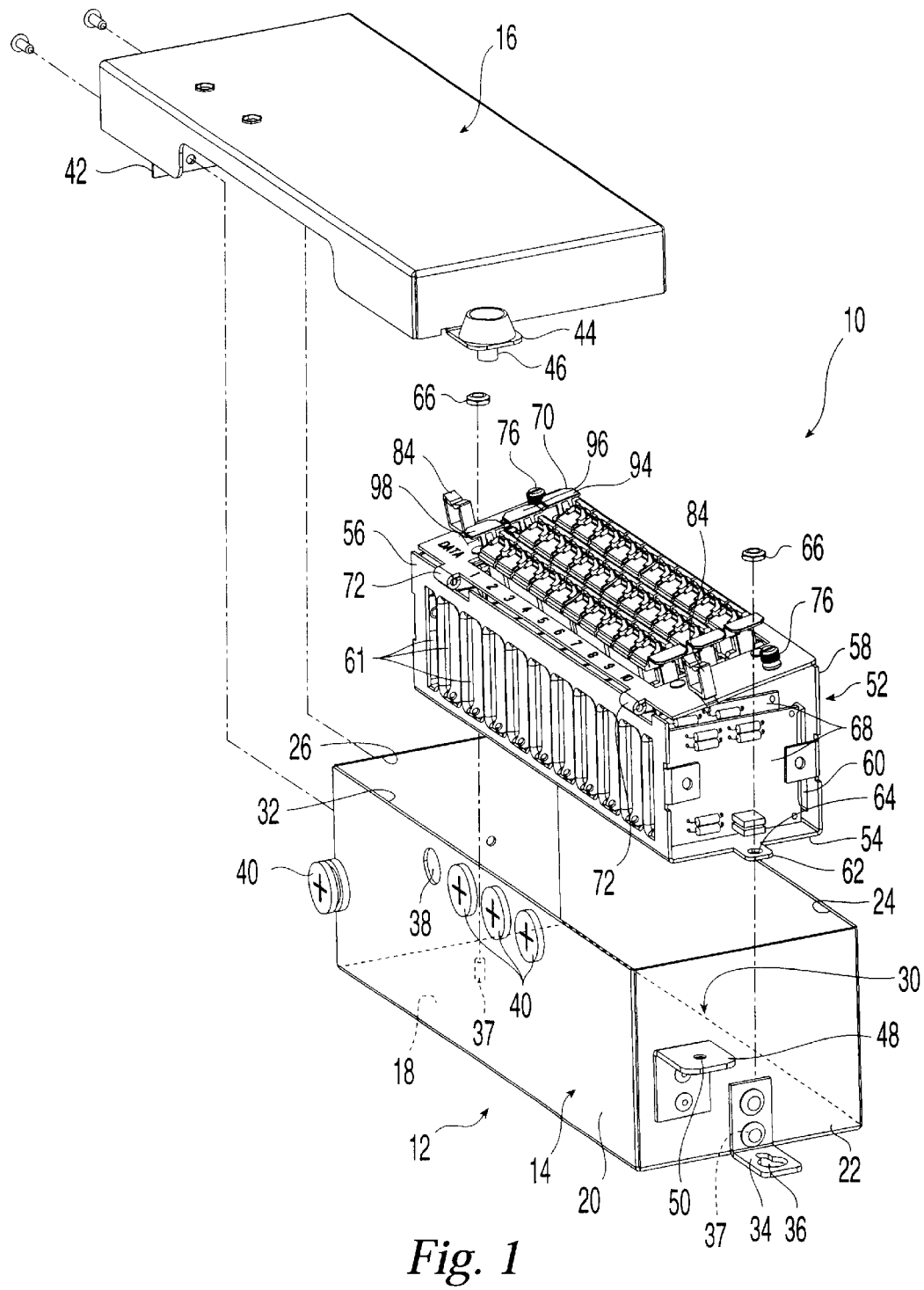
FIG. 1 is a partially exploded view of an exemplary multi-dwelling unit phone splitter assembly constructed in accordance with the present invention.

FIG. 1 depicts an exemplary telephone line splitter assembly 10 constructed in accordance with the present invention. The splitter assembly 10 has an outer protective housing 12 that is made up of a base portion 14 and a removable cover 16. The base portion 14 has a substantially rectangular rear plate 18 that is affixed to four sidewalls 20, 22, 24 and 26. In FIG. 1, the base portion 14 is shown lying on its rear plate 18. In practice, however, the rear plate 18 is designed to abut a mounting surface (not shown) such as a wall at or around a building entrance terminal. The presence of the protective housing 12 makes the splitter assembly 10 particularly useful with building entrance terminals that are located outdoors or that are otherwise vulnerable to moisture. The base portion 14 may also be an integral piece (i.e., made by injection molding).

The rear plate 18 and sidewalls 20, 22, 24, 26 define an enclosure 30 having a frontside opening 32. Two tabs 34 extend outwardly from either end of the rear plate 18 and each contain holes 36 through which screws or other connectors (not shown) can be disposed for attachment of the base portion 14 to a mounting surface. Two threaded posts 37 extend outwardly from the rear plate 18 inside the enclosure 30. It is presently preferred that the base portion 14 and the cover 16 are formed of 0.063" thick aluminum.

The lower sidewall 20 of the base portion 14 contains a number of apertures 38 through which electrical wiring (not shown) may be disposed. Break-though rubber grommets 40 are disposed in each of the apertures 38. These grommets 40 can be centrally ruptured to permit the passage of electrical wiring and the like.

Figure 4:
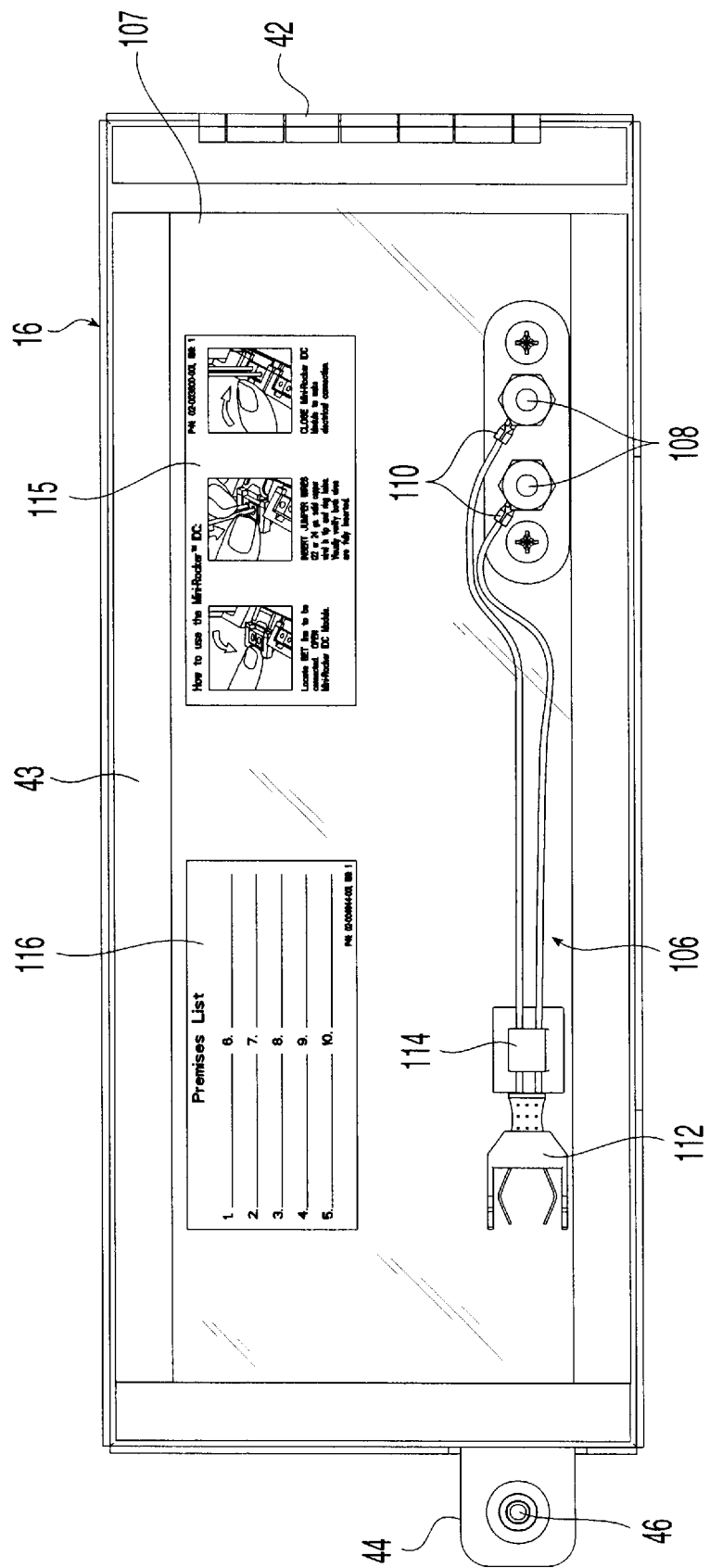
FIG. 4 illustrates features of an exemplary cover portion of the housing for the phone splitter assembly shown in FIG. 1.

The cover 16 is affixed to the base portion 14 by a hinge 42 (partially shown in FIG. 1) for selective access to the enclosure 30 of the base portion 14. As can be seen in FIG. 4, which shows the inner surface of the cover 16, an elastomeric gasket 43 is affixed to the perimeter of the inner surface of the cover 16 to engage and seal against the sidewalls 20, 22, 24 and 26 of the base portion 14 when the cover 16 is closed onto the base portion 14. Due to this sealing, the outer housing 12 is substantially weather-resistant. On the edge of the cover 16 opposite the hinge 42 is a tab 44 that retains a securing screw 46. A complimentary tab 48 is located on the sidewall 22 of the base portion 14 and contains a screw hole 50. When the cover 16 is closed onto the base portion 14, it can be secured to the base portion 14 by rotating the securing screw 46 into the screw hole 50.

Figure 2:
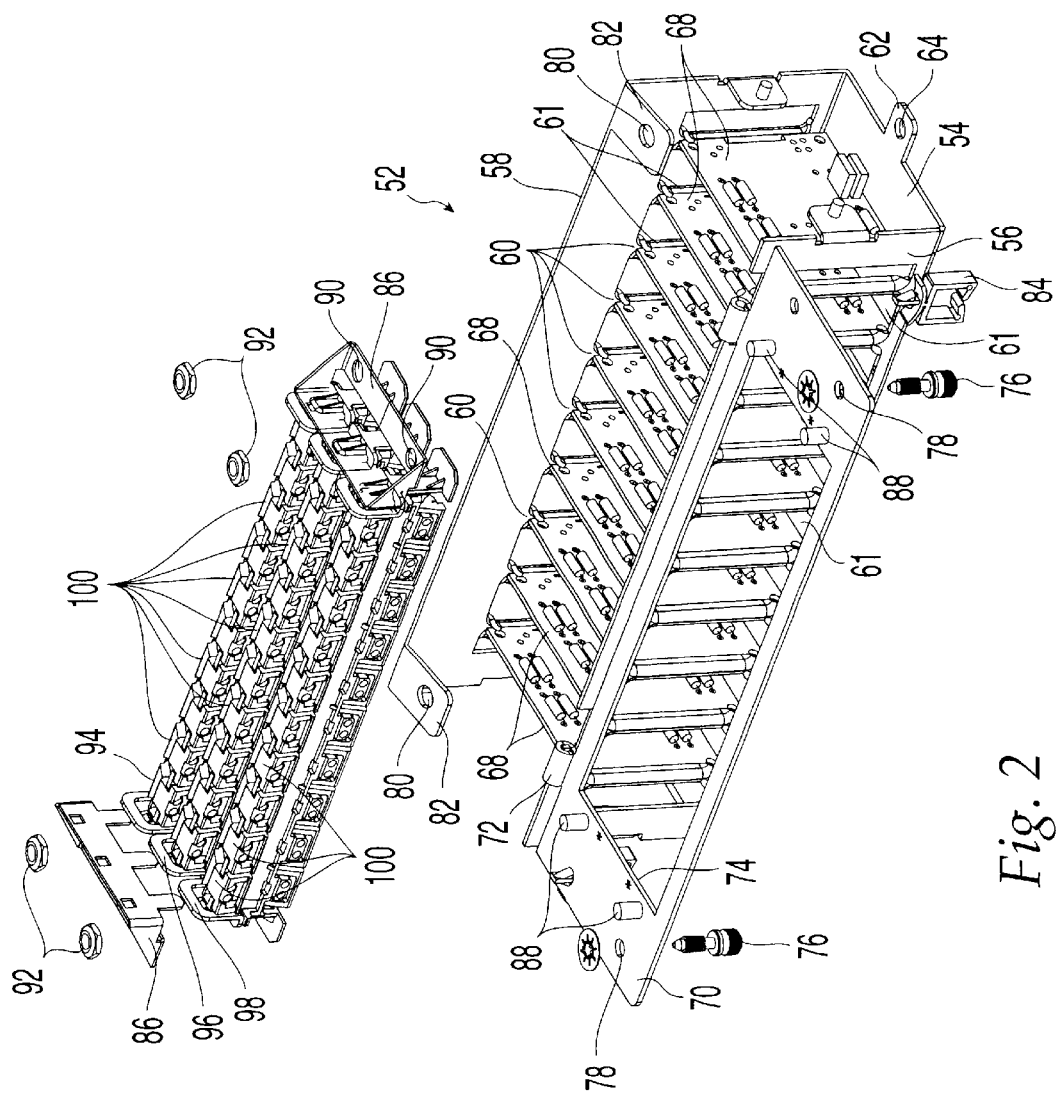
FIG. 2 is a partially exploded view of an exemplary card retainer assembly used in conjunction with the assembly shown in FIG. 1.

The base portion 14 contains a removable card retainer 52 that is illustrated in greater detail in FIG. 2. The card retainer 52 is formed of a base plate 54 with a pair of opposed sides 56, 58 that each contain a plurality of longitudinal retaining slots 60 in a side-by-side arrangement. In one preferred embodiment, one of the sides 58 extends upwardly from the base plate 54 a slightly greater distance that the other slotted side 56. Longitudinal vents 61 are cut between the retaining slots 60 thereby allowing ventilation for the electrical components located within the card retainer 52.

The base plate 54 of the card retainer 52 has a pair of laterally-located attachment tabs 62 (one shown) with holes 64 disposed therethrough. The base plate 54 is affixed to the rear plate 18 of the base portion 14 by disposing the threaded posts 37 through the holes 64 of the tabs 62 and then affixing a pair of nuts, 66 in FIG. 1, to the threaded posts 37. It is noted that the card retainer 52 is removably affixed to the base portion 14 in this manner so that the card retainer 52 can be easily removed, if necessary, and replaced with a card retainer suitable for carrying cards or boards using another type of telephone protocol. This feature allows the splitter assembly to be readily retrofitted to change between a VDSL protocol and an ADSL protocol. This feature also allows for easy field service.

The retaining slots 60 are shaped and sized to receive a number of individual POTS splitter cards 68. The POTS splitter cards 68 are known electrical components that are capable of splitting a single telephone line into two separate telephone lines. Such components are commercially available from, for example, Barth Tech, Inc., 732 Ave. R, Grand Prairie, Tex. 75050, which makes a VDSL splitter card. Other telephone line splitter components may be used as well.

A substantially rectangular faceplate 70 is affixed by hinged connections 72 to the card retainer 52 so that the faceplate 70 can be selectively closed over the POTS splitter cards 68 in the manner of a hinged cover. The faceplate 70 is more clearly shown in FIG. 2 and defines a rectangular window 74. The faceplate 70 also carries a pair of thumb turn-type attachment screws 76 that pass through holes 78 in the faceplate 70 and can be secured within holes 80 in complimentary projections 82 that extend from side 58 of the card retainer 52. In this manner, the faceplate 70 can be secured in the closed position.

One or more cable clips 84 can be affixed to the faceplate 70. Such clips are useful for the management of excess electrical wires and cables that will typically surround the faceplate 70 of the card retainer 52 in operation.

As FIG. 2 shows, the rear side of the faceplate 70 carries a pair of brackets 86 that are affixed to the faceplate 70 by threaded posts 88 that pass through apertures 90 in each of the brackets 86. The affixation is completed with the use of nuts 92 that are threadedly secured to the posts 88.

Three rows 94, 96, 98 of tool-less IDCs 100 are disposed within the window 74 of the faceplate 70 thereby providing a panel to which all external electrical connections with the splitter assembly 10 are made. It is currently preferred that there be ten tool-less IDCs 100 in each of the rows 94, 96, 98. However, any number of them may be located in the rows 94, 96, 98, as dictated by the needs of the particular structure where the device 10 is being used. Tool-less IDCs 100 are known components that are used to retain a pair of electrical wires. As is known, a portion of the IDC 100 rotates outwardly from the rest of the IDC 100 to expose a pair of apertures that each receive a wire. The outwardly rotated portion of the IDC 100 is then rotated back to its original position to secure the wires within. The attachment of such wiring to a tool-less IDC 100 is well understood by those of skill in the art and is, therefore, not described in any detail here. It is pointed out that the brackets 86 on either end of the window 74 are used to secure the IDC rows 94, 96, 98 within the window 74. The top row of tool-less IDCs 100 is used for attachment of incoming telephone lines. The lower two rows 96, 98 of tool-less IDCs 100 are used for attachment of voice and data line wiring, respectively (not shown). Electrical connections must be made, typically in advance, between one tool-less IDC 100 in each of the rows 94, 96 and 98 and a single POTS splitter card 68 located near the tool-less IDCs 100. However, these connections are not described in detail as such are well understood by those of skill in the art.

When secured in the closed position, the faceplate 70 of a preferred embodiment is disposed in a slanted orientation, as FIG. 1 shows, by virtue of the fact that the side 58 extends a greater distance away from the base plate 54 that does the side 56. This slant for the panel created by the faceplate 70 and tool-less IDCs 100 permits wires to be more easily inserted and removed from each of the rows of tool-less IDCs 100 by more clearly presenting the holes of the tool-less IDCs 100 when the tool-less IDC 100 is opened to accept wires.

Figure 3:
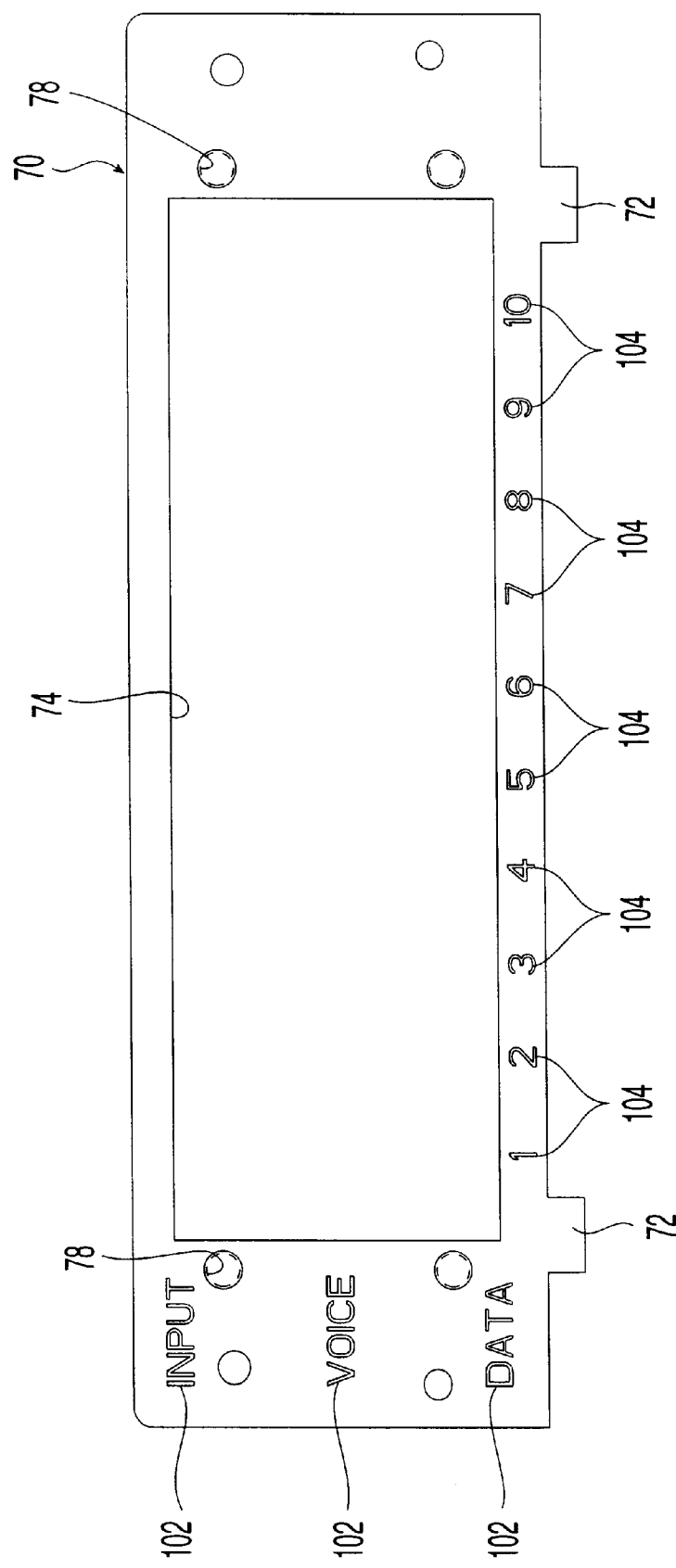
FIG. 3 depicts an exemplary faceplate used with the assemblies shown in FIGS. 1 and 2.

As best shown in FIG. 3, the faceplate 70 carries written indicia that designates the row and column position of tool-less IDCs 100. Specifically, row designators 102 and column designators 104 are used so that specific tool-less IDCs 100 may be easily identified by workers. In the illustrated embodiment, the row designators 102 are the words INPUT, VOICE and DATA while the column designators 104 are numerals 1, 2, 3 . . . 10. Thus, a specific tool-less IDC might be conveniently identified as "VOICE, 2" or "INPUT, 6."

FIG. 4 illustrates that a test probe assembly 106 is typically retained upon the inside surface 107 of the cover 16. A pair of screw posts 108 are located on the inside surface of the cover 16 and serve as grounding terminals for the test probe assembly 106. The test probe assembly 106 includes a pair of electrical wire leads 110 that extend from the screw posts 108 and terminate in a probe tester 112 that is shaped and sized to be secured in a complimentary manner to a tool-less IDC 100. It is noted that the leads 110 can be wrapped around the screw posts 108 when not in use, as illustrated in FIG. 4. In addition, a retaining clip 114 is secured to the inside of the cover 16 and retains portions of the leads 110 so that the probe tester 112 is conveniently stored within the cover 16. Additionally, the interior surface 107 of the cover 16 is also a convenient location for the placement of useful printed matter such as instructions 115 or a list of premises 116 with which the splitter assembly 10 is associated.

In operation, incoming POTS wires and outgoing subscriber circuitry is brought into the enclosure 30 of the housing 12 through the apertures 38 and grommets 40. The incoming POTS lines are affixed to one or more of the tool-less IDCs 100 in the INPUT row 94. Subscriber circuitry is affixed to IDCs 100 in the VOICE row 96 and DATA row 98. The circuitry of the splitter cards 68 will split the incoming line into two separate voice and data outputs. The presence of the faceplate 70 and the tool-less IDCs 100 allows workers to make the necessary connections without having to access individual splitter cards 68 or like components. As a result, the assembly 10 of the invention provides a device that is easy to use and provides protection for the cards 68 from inadvertent damage during installation of the circuitry.

Further, the hinged affixation of the faceplate 70 to the card retainer 52 allows the faceplate 70 and tool-less IDCs 100 to be easily moved out of the way to allow access to the individual POTS splitter cards 68. Therefore, a damaged or inoperable card can be easily replaced.

In addition, the entire card retainer 52 can be easily removed from the housing 12 by the removal of the pair of nuts 66, thereby allowing another retainer with substitute cards to be put into the housing 12 in its place. Advantageously, no connections between the cards 68 and the tool-less IDCs 100 would have to be disturbed in making this exchange, thereby saving time and preventing the risk of incorrect connections being made. One might exchange, for example, a card retainer suitable for ADSL telephone protocol with a card retainer suitable for VDSL protocol.

Figure 5:
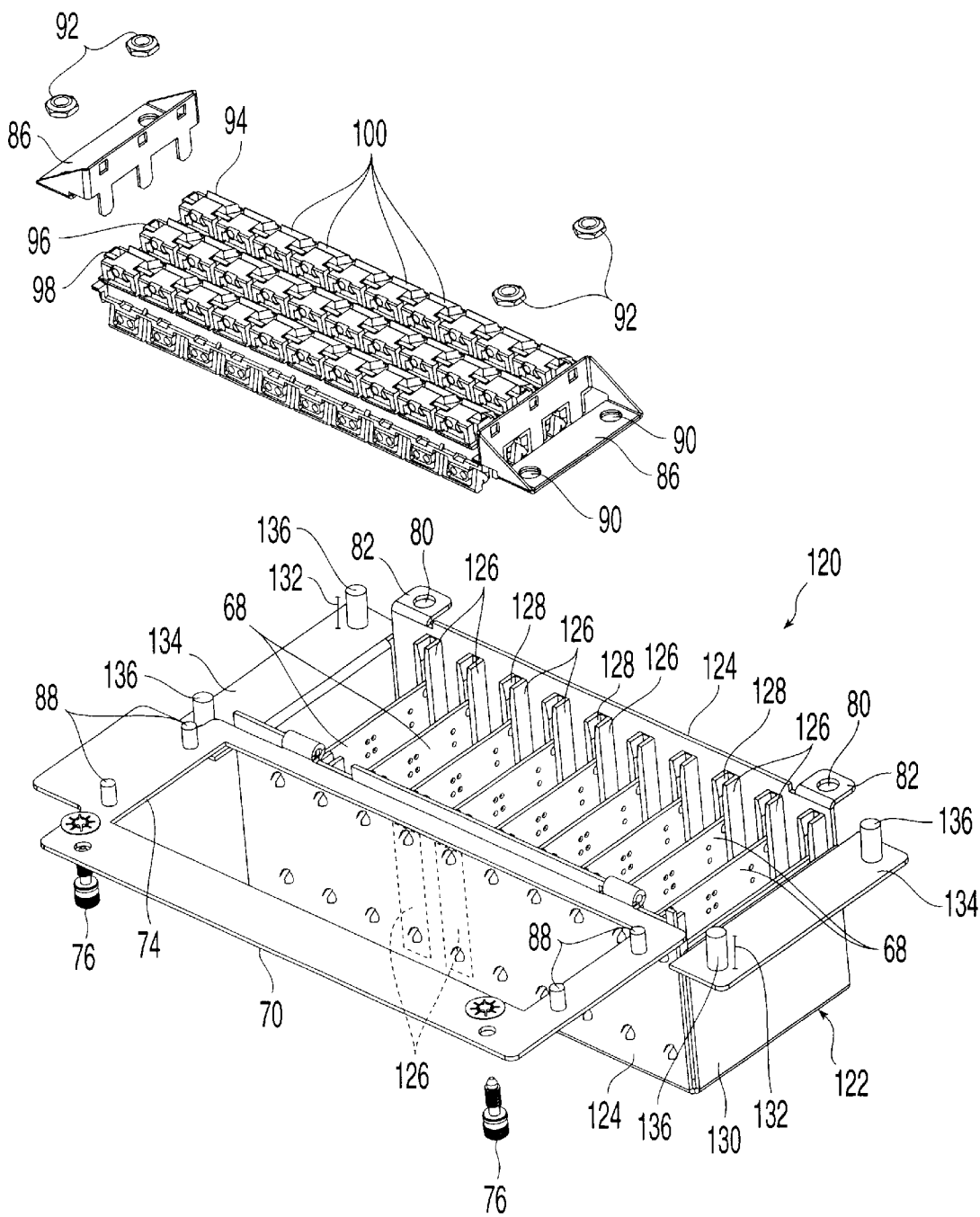
FIG. 5 illustrates an alternative embodiment for a multi-dwelling unit phone splitter assembly.

FIG. 5 depicts an alternative splitter assembly 120 wherein the card retainer portion of the assembly is not contained within a separate outer housing. Instead, the cards are retained within an enclosure that is shaped and sized to fit within a portion of the cabinet of a building entrance terminal (not shown). For clarity, like reference numerals between the two embodiments are used for like components. The splitter assembly 120 has a retainer housing 122 that is formed of a rear plate (not visible in FIG. 5) with upper and lower sidewalls 124. A series of opposing guides 126 are attached to both sidewalls 124, each of the guides 126 having a central slot 128 shaped and sized to receive a splitter card 68. It is noted that the sidewalls 124 are spaced a proper distance from one another to allow the splitter cards 68 to be slidingly inserted into the slots 128.

As can be seen in FIG. 5, the housing 122 also has a faceplate 70 that is hingedly attached to one sidewall 124. The faceplate 70 can be opened and closed onto the retainer housing 122 and, in the closed position, can be secured to the housing 122 with thumb-turn screws 76. The retainer housing 122 also has two end walls 130 (one shown) located at either longitudinal end of the housing 122. The end walls 130 each adjoin the two side walls 124 to define an enclosure within which the splitter cards 68 reside. The end walls 130 do not extend outwardly from the rear plate as far as the sidewalls 124 do, thereby creating a gap 132 between the sidewalls 124 when the faceplate 70 is secured onto the housing 122. The gap 132 accommodates incoming and outgoing electrical wiring.

Figure 6:
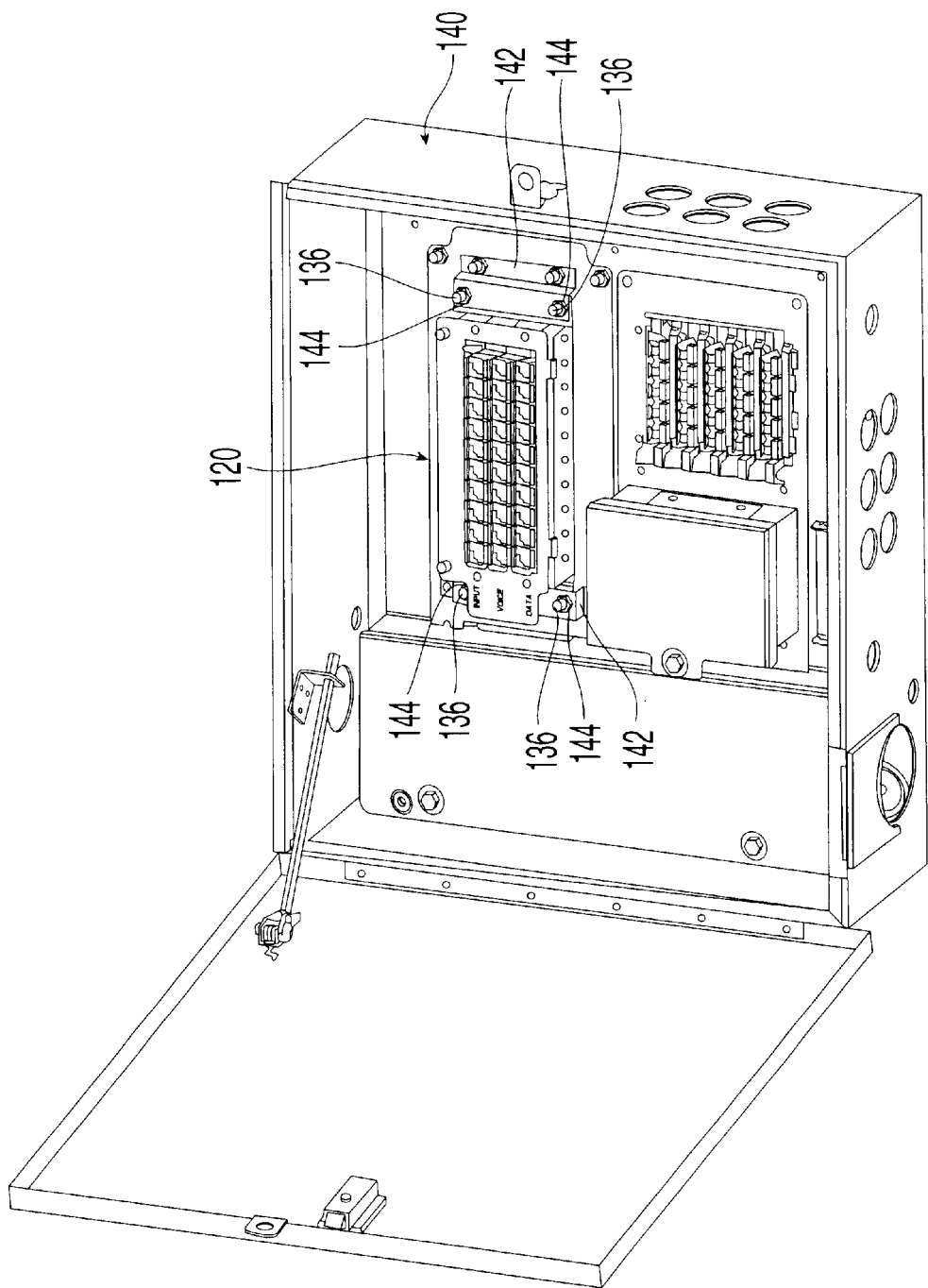
FIG. 6 is an isometric view depicting an exemplary phone splitter assembly mounted within a building entrance terminal.

Flanges 134 extend laterally outward in opposite directions from each end wall 130. A pair of threaded posts 136 are mounted on each flange 134. When it is desired to secure the splitter assembly 120 within a building entrance terminal, the posts 136 are inserted from the backside through complimentary holes associated with the operations panel of a building entrance terminal. FIG. 6 illustrates the splitter assembly 120 mounted in a building entrance terminal 140. As can be seen, the posts 136 are inserted through holes in securing plates 142 that are, in turn, secured to a front panel of the terminal 140. Nuts 144 are then secured to the posts 136. It will be understood that this method of mounting is shown by way of example only and that the type of building entrance terminal and the method of mounting may vary.

Although not illustrated, it is contemplated that the cards or boards could also be attached to the bottom side of the brackets 86 or IDC's 100 rather than in the slots 60. In this embodiment, the faceplate 70, IDCs 100, and cards or boards, could then be inserted into a retainer 52 to protect the cards or boards.

While the invention has been shown or described in only some of its forms, it should be apparent to those skilled in the art that it is not so limited, but is susceptible to various changes within departing from the scope of the invention.

What is claimed is:

1. A telephone line splitter assembly for splitting at least one plain old telephone service (POTS) line carrying a combined signal into a separate voice line carrying a voice signal and a separate data line carrying a data signal, the assembly comprising:
   - a plurality of POTS splitter cards;
   - a card retainer comprising a base plate and a pair of opposed sides extending outwardly from the base plate, the base plate and the opposed sides defining a cavity forming a plurality of retaining slots in side-by-side arrangement extending transversely between the opposed sides, the retaining slots shaped and sized to receive the POTS splitter cards;
   - a faceplate movably attached to one of the opposed sides of the card retainer and adapted to be opened and closed on the card retainer, the faceplate defining a window opposite the retaining slots; and
   - a plurality of connectors disposed within the window of the faceplate, each of the connectors electrically connected to one of the POTS splitter cards, the plurality of connectors comprising a first connector for electrically connecting the one POTS splitter card and the POTS line, a second connector for electrically connecting the one POTS splitter card and the voice line, and a third connector for electrically connecting the one POTS splitter card and the data line.

2. The telephone line splitter assembly of claim 1 wherein the faceplate is hinged to one of the opposed sides of the card retainer such that the faceplate and the connectors are movable relative to the card retainer to provide access to the POTS splitter cards.

3. The telephone line splitter assembly of claim 1 wherein one of the opposed sides of the card retainer extends outwardly from the base plate farther than the other opposed side such that the faceplate and the connectors are angled relative to the base plate when the faceplate is closed on the card retainer.

4. The telephone line splitter assembly of claim 1 wherein the connectors are tool-less insulation displacement connectors (IDCs).

5. The telephone line splitter assembly of claim 1 wherein the card retainer further comprises a plurality of vents positioned between the retainig slots.

6. The telephone line splitter assembly of claim 1 wherein the faceplate carries written indicia providing row and column designators for the identification of each of the plurality of connectors.

7. The telephone line splitter assembly of claim 1 further comprising a substantially weather-resistant housing for enclosing the card retainer, the faceplate and the connectors.

8. The telephone line splitter assembly of claim 7 wherein the housing comprises a base defining an enclosure for receiving the card retainer and the faceplate; and a cover removably affixed to the base and adapted to be opened and closed on the base.

9. The telephone line splitter assembly of claim 7 further comprising a test probe secured within the housing for testing the electrical connections between the connectors and the POTS splitter cards.

* * * * *